(12) United States Patent
Ilic

(10) Patent No.: US 8,395,078 B2
(45) Date of Patent: Mar. 12, 2013

(54) ARC RECOVERY WITH OVER-VOLTAGE PROTECTION FOR PLASMA-CHAMBER POWER SUPPLIES

(75) Inventor: Milan Ilic, Fort Collins, CO (US)

(73) Assignee: Advanced Energy Industries, Inc, Fort Collins, CO (US)

( * ) Notice: Subject to any disclaimer, the term of this patent is extended or adjusted under 35 U.S.C. 154(b) by 606 days.

(21) Appl. No.: 12/631,735

(22) Filed: Dec. 4, 2009

(65) Prior Publication Data
US 2010/0140231 A1  Jun. 10, 2010

Related U.S. Application Data

(60) Provisional application No. 61/120,250, filed on Dec. 5, 2008.

(51) Int. Cl.
  *B23K 9/06* (2006.01)
(52) U.S. Cl. ......... 219/121.59; 204/192.12; 204/192.13; 204/298.08; 315/111.21; 324/536
(58) Field of Classification Search ................ 361/1–14; 219/121.54
See application file for complete search history.

(56) References Cited

U.S. PATENT DOCUMENTS

| | | | |
|---|---|---|---|
| 3,867,669 A | 2/1975 | Krasik et al. |
| 4,271,369 A | 6/1981 | Stillwagon |
| 4,276,507 A | 6/1981 | Stillwagon |
| 4,299,678 A | 11/1981 | Meckel |
| 4,428,023 A | 1/1984 | Maier |
| 4,459,629 A | 7/1984 | Titus |
| 4,484,243 A | 11/1984 | Herbst et al. |
| 4,540,607 A | 9/1985 | Tsao |
| 4,557,819 A | 12/1985 | Meacham et al. |
| 4,585,986 A | 4/1986 | Dyer |
| 4,589,123 A | 5/1986 | Pearlman et al. |
| 4,740,858 A | 4/1988 | Yamaguchi et al. |
| 4,792,730 A | 12/1988 | Mintchev et al. |
| 4,870,529 A | 9/1989 | Powell et al. |
| 4,871,421 A | 10/1989 | Ogle et al. |
| 4,901,621 A | 2/1990 | Tidman |
| 4,936,960 A | 6/1990 | Siefkes et al. |
| 4,999,760 A | 3/1991 | Tietema |
| 5,192,894 A | 3/1993 | Teschner |
| 5,241,152 A | 8/1993 | Anderson et al. |

(Continued)

FOREIGN PATENT DOCUMENTS

| | | |
|---|---|---|
| EP | 0564789 A1 | 2/1993 |
| WO | WO2006014212 A2 | 2/2006 |

(Continued)

OTHER PUBLICATIONS

Korean Intellectual Property Office, "Notice of Request for Submission of Argument; Office Action re Korean application No. 10-2009-7018460", Feb. 15, 2012, p. 7, Published in: KR.

(Continued)

*Primary Examiner* — Wai Sing Louie
*Assistant Examiner* — William Harriston
(74) *Attorney, Agent, or Firm* — Neugeboren O'Dowd PC

(57) ABSTRACT

A system and method for managing power delivered to a processing chamber is described. In one embodiment current is drawn away from the plasma processing chamber while initiating an application of power to the plasma processing chamber during an initial period of time, the amount of current being drawn away decreasing during the initial period of time so as to increase the amount of power applied to the plasma processing chamber during the initial period of time.

15 Claims, 7 Drawing Sheets

U.S. PATENT DOCUMENTS

| | | | |
|---|---|---|---|
| 5,275,083 A | 1/1994 | Hawke et al. |
| 5,281,321 A | 1/1994 | Sturmer et al. |
| 5,286,360 A | 2/1994 | Szczyrbowski |
| 5,303,139 A | 4/1994 | Mark |
| 5,307,004 A | 4/1994 | Carsten |
| 5,377,218 A | 12/1994 | Guenther |
| 5,415,757 A | 5/1995 | Szcyrbowski et al. |
| 5,418,707 A | 5/1995 | Shimer et al. |
| 5,427,669 A | 6/1995 | Drummond |
| 5,488,535 A | 1/1996 | Masghati et al. |
| 5,517,085 A | 5/1996 | Engemann et al. |
| 5,535,906 A | 7/1996 | Drummond |
| 5,573,596 A | 11/1996 | Yin |
| 5,576,939 A | 11/1996 | Drummond |
| 5,584,972 A | 12/1996 | Lantsman |
| 5,584,974 A | 12/1996 | Sellers |
| 5,611,899 A | 3/1997 | Maass |
| 5,616,224 A | 4/1997 | Boling |
| 5,645,698 A | 7/1997 | Okano |
| 5,651,865 A | 7/1997 | Sellers |
| 5,682,067 A | 10/1997 | Manley et al. |
| 5,698,082 A | 12/1997 | Teschner et al. |
| 5,708,250 A | 1/1998 | Benjamin et al. |
| 5,718,813 A | 2/1998 | Drummond et al. |
| 5,725,675 A | 3/1998 | Fong et al. |
| 5,731,565 A | 3/1998 | Gates |
| 5,750,971 A | 5/1998 | Taylor |
| 5,814,195 A | 9/1998 | Lehan et al. |
| 5,815,388 A | 9/1998 | Manley et al. |
| 5,851,365 A | 12/1998 | Scobey |
| 5,855,745 A | 1/1999 | Manley |
| 5,882,492 A | 3/1999 | Manley et al. |
| 5,889,391 A | 3/1999 | Coleman |
| 5,917,286 A | 6/1999 | Scholl et al. |
| 6,001,224 A | 12/1999 | Drummond |
| 6,005,218 A | 12/1999 | Walde et al. |
| 6,024,844 A | 2/2000 | Drummond et al. |
| 6,046,641 A | 4/2000 | Chawla et al. |
| 6,080,292 A | 6/2000 | Matsuzawa et al. |
| 6,135,998 A | 10/2000 | Palanker |
| 6,161,332 A | 12/2000 | Avot |
| 6,162,332 A | 12/2000 | Chiu |
| 6,174,450 B1 | 1/2001 | Patrick et al. |
| 6,176,979 B1 | 1/2001 | Signer et al. |
| 6,217,717 B1 | 4/2001 | Drummond et al. |
| 6,222,321 B1 | 4/2001 | Scholl et al. |
| 6,238,513 B1 | 5/2001 | Arnold et al. |
| 6,258,219 B1 | 7/2001 | Mueller |
| 6,321,531 B1 | 11/2001 | Caren et al. |
| 6,332,961 B1 | 12/2001 | Johnson et al. |
| 6,365,009 B1 | 4/2002 | Ishibashi |
| 6,416,638 B1 | 7/2002 | Kuriyama et al. |
| 6,433,987 B1 | 8/2002 | Liptak |
| 6,440,281 B1 | 8/2002 | Sturmer |
| 6,447,655 B2 | 9/2002 | Lantsman |
| 6,447,719 B1 | 9/2002 | Agamohamadi et al. |
| 6,472,822 B1 | 10/2002 | Chen et al. |
| 6,484,707 B1 | 11/2002 | Frus et al. |
| 6,507,155 B1 | 1/2003 | Barnes et al. |
| 6,521,099 B1 | 2/2003 | Drummond et al. |
| 6,522,076 B2 * | 2/2003 | Goedicke et al. ......... 315/111.21 |
| 6,524,455 B1 | 2/2003 | Sellers |
| 6,552,295 B2 | 4/2003 | Markunas et al. |
| 6,577,479 B1 | 6/2003 | Springer et al. |
| 6,621,674 B1 * | 9/2003 | Zahringer et al. .............. 361/58 |
| 6,636,545 B2 | 10/2003 | Krasnov |
| 6,708,645 B1 | 3/2004 | Choquette |
| 6,736,944 B2 | 5/2004 | Buda |
| 6,740,207 B2 | 5/2004 | Kloeppel et al. |
| 6,753,499 B1 | 6/2004 | Yasaka et al. |
| 6,808,607 B2 * | 10/2004 | Christie ................... 204/298.08 |
| 6,817,388 B2 | 11/2004 | Tsangaris |
| 6,876,205 B2 | 4/2005 | Walde et al. |
| 6,878,248 B2 | 4/2005 | Signer et al. |
| 6,894,245 B2 | 5/2005 | Hoffman et al. |
| 6,943,317 B1 * | 9/2005 | Ilic et al. .................. 219/121.57 |
| 6,967,305 B2 | 11/2005 | Sellers |
| 7,026,174 B2 | 4/2006 | Fischer |
| 7,030,335 B2 | 4/2006 | Hoffman et al. |
| 7,081,598 B2 | 7/2006 | Ilic |
| 7,086,347 B2 | 8/2006 | Howald et al. |
| 7,095,179 B2 | 8/2006 | Chistyakov |
| 7,132,618 B2 | 11/2006 | Hoffman et al. |
| 7,169,256 B2 | 1/2007 | Dhindsa et al. |
| 7,179,987 B2 | 2/2007 | Fath et al. |
| 7,247,218 B2 | 7/2007 | Hoffman |
| 7,261,797 B2 | 8/2007 | Sellers |
| 7,305,311 B2 | 12/2007 | Van Zyl |
| 7,471,047 B2 | 12/2008 | Ogawa |
| 7,498,908 B2 | 3/2009 | Gurov |
| 7,503,996 B2 | 3/2009 | Chen et al. |
| 7,514,935 B2 * | 4/2009 | Pankratz ..................... 324/536 |
| 7,651,492 B2 | 1/2010 | Wham |
| 8,044,594 B2 * | 10/2011 | Morgan et al. ........... 315/111.21 |
| 2001/0047933 A1 * | 12/2001 | Lantsman ................ 204/192.13 |
| 2002/0104753 A1 * | 8/2002 | Kloeppel et al. ......... 204/192.12 |
| 2002/0108933 A1 | 8/2002 | Hoffman et al. |
| 2002/0170678 A1 | 11/2002 | Hayashi et al. |
| 2003/0136766 A1 | 7/2003 | Hoffman et al. |
| 2003/0146083 A1 | 8/2003 | Sellers |
| 2003/0192475 A1 | 10/2003 | Shannon et al. |
| 2003/0205460 A1 * | 11/2003 | Buda ....................... 204/192.13 |
| 2003/0205557 A1 | 11/2003 | Benjamin et al. |
| 2004/0026235 A1 | 2/2004 | Stowell, Jr. |
| 2004/0027209 A1 | 2/2004 | Chen et al. |
| 2004/0055881 A1 | 3/2004 | Christie |
| 2004/0124077 A1 | 7/2004 | Christie |
| 2004/0149699 A1 | 8/2004 | Hofman et al. |
| 2004/0182696 A1 | 9/2004 | Kuriyama et al. |
| 2004/0182697 A1 * | 9/2004 | Buda ....................... 204/298.08 |
| 2004/0191950 A1 | 9/2004 | Nakamura et al. |
| 2004/0226657 A1 | 11/2004 | Hoffman |
| 2004/0245999 A1 * | 12/2004 | Walde et al. .................. 324/536 |
| 2005/0035770 A1 | 2/2005 | Hopkins et al. |
| 2005/0040144 A1 | 2/2005 | Sellers |
| 2005/0092596 A1 | 5/2005 | Kouznetsov |
| 2005/0167262 A1 | 8/2005 | Sellers |
| 2005/0236377 A1 | 10/2005 | Hoffman et al. |
| 2005/0258148 A1 | 11/2005 | Condrashoff |
| 2005/0264218 A1 | 12/2005 | Dhindsa et al. |
| 2006/0011591 A1 | 1/2006 | Sellers |
| 2006/0049831 A1 | 3/2006 | Anwar et al. |
| 2006/0054601 A1 * | 3/2006 | Ilic et al. .................. 219/121.59 |
| 2006/0057854 A1 | 3/2006 | Setsuhara et al. |
| 2006/0066248 A1 | 3/2006 | Chistyakov |
| 2006/0189168 A1 | 8/2006 | Sato et al. |
| 2006/0213761 A1 | 9/2006 | Axenbeck et al. |
| 2006/0214599 A1 | 9/2006 | Ogawa |
| 2006/0241879 A1 | 10/2006 | Van Zyl |
| 2006/0252283 A1 | 11/2006 | Takeda et al. |
| 2006/0278608 A1 | 12/2006 | Hoffman |
| 2007/0008034 A1 | 1/2007 | Tayrani |
| 2007/0042131 A1 | 2/2007 | Soo et al. |
| 2007/0080903 A1 | 4/2007 | Lee |
| 2007/0139122 A1 | 6/2007 | Nagarkatti et al. |
| 2008/0061794 A1 * | 3/2008 | Pankratz ..................... 324/536 |
| 2008/0122369 A1 | 5/2008 | Nitschke |
| 2008/0156632 A1 | 7/2008 | Van Zyl |
| 2008/0203070 A1 * | 8/2008 | Ilic et al. .................. 219/121.57 |
| 2008/0309402 A1 | 12/2008 | Ozimek et al. |
| 2010/0026186 A1 | 2/2010 | Forrest et al. |
| 2010/0213903 A1 | 8/2010 | Ozimek et al. |

FOREIGN PATENT DOCUMENTS

| | | | |
|---|---|---|---|
| WO | WO2006023847 A1 | 3/2006 |
| WO | WO2008033968 A2 | 3/2008 |

OTHER PUBLICATIONS

Korean Intellectual Property Office, "Notice of Request for Submission of Argument; Office Action re Korean application No. 10-2009-7018460", , p. 7, Published in: KR.

Burke, J., "International Search Report re Application No. PCT/US07/078339", Aug. 29, 2008, p. 10, Published in: PCT.

Baharlou, Simin, "International Preliminary Report on Patentability re application No. PCT/US09/051174", Feb. 10, 2001, Published in: WO.

Mulhausen, Dorothee, "International Preliminary Report on Patentability re application No. PCT/US09/066899", Jun. 16, 2011, p. 7, Published in: WO.

Young, Lee W., "PCT International Search Report re Application No. PCT/US08/054056", Jun. 25, 2008, Published in: PCT.

Kolev, Vesselin, "PCT International Search Report re Application No. PCT/US09/066899", Feb. 19, 2010, Published in: PCT.

Kim, Ki Wan, "PCT International Search Report re Application No. PCT/US09/051174", Feb. 24, 2010, Publisher: PCT, Published in: PCT.

* cited by examiner

US 8,395,078 B2

ARC RECOVERY WITH OVER-VOLTAGE PROTECTION FOR PLASMA-CHAMBER POWER SUPPLIES

PRIORITY

The present application claims priority to U.S. Provisional Patent Application No. 61/120,250 entitled ARC RECOVERY WITH OVER-VOLTAGE PROTECTION FOR PLASMA-CHAMBER POWER SUPPLIES, filed Dec. 5, 2008.

FIELD OF THE INVENTION

This invention relates generally to power supplies for plasma processing applications, and more particularly to systems and methods to manage the application of power therein.

BACKGROUND OF THE INVENTION

In plasma processing applications, arcs are known to develop when a discharge occurs between a point on a cathode where charge has accumulated and a point on the anode. If not extinguished quickly, arcs can be very detrimental to the process and the quality of the processed film.

To reduce energy supplied into an arc, many power supplies divert energy from the arc and circulate the energy within energy storing components of the power supply for a period of time in order to extinguish the plasma arc. After the plasma arc is extinguished, however, the energy circulated within the power supply can cause, for example, an over-voltage condition that can damage the power supply and/or plasma chamber if the energy is released to the plasma chamber. Also this high voltage may lead to another arc.

Although present devices are functional for many applications, they are not sufficient for many implementations or are otherwise satisfactory. Accordingly, a system and method are needed to address the shortfalls of present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Embodiments of the present invention can provide a system and method for supplying energy a processing chamber. In one exemplary embodiment, current is drawn away from the plasma processing chamber while initiating an application of power to the plasma processing chamber during an initial period of time, the amount of current being drawn away decreasing during the initial period of time so as to increase the amount of power applied to the plasma processing chamber during the initial period of time. And in some variations, the current that is drawn away from the plasma processing chamber is converted to stored energy and discharged.

Another embodiment may be characterized as an apparatus for supplying energy to a plasma processing chamber. The apparatus in this embodiment includes an input terminal adapted to receive power that is generated by a power supply; an output terminal configured to apply the power generated by a power supply so that the power may be utilized by a plasma processing chamber; an energy diversion component configured to draw a decreasing amount of energy away from the output terminal so that the output terminal is capable of gradually increasing a level of energy from a low level of energy that is insufficient to ignite the plasma in the plasma processing chamber to a level sufficient to ignite plasma in the plasma processing chamber; and an energy discharge component configured to draw energy away from the energy diversion component so as enable the energy diversion component to draw more energy away from the output terminal.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
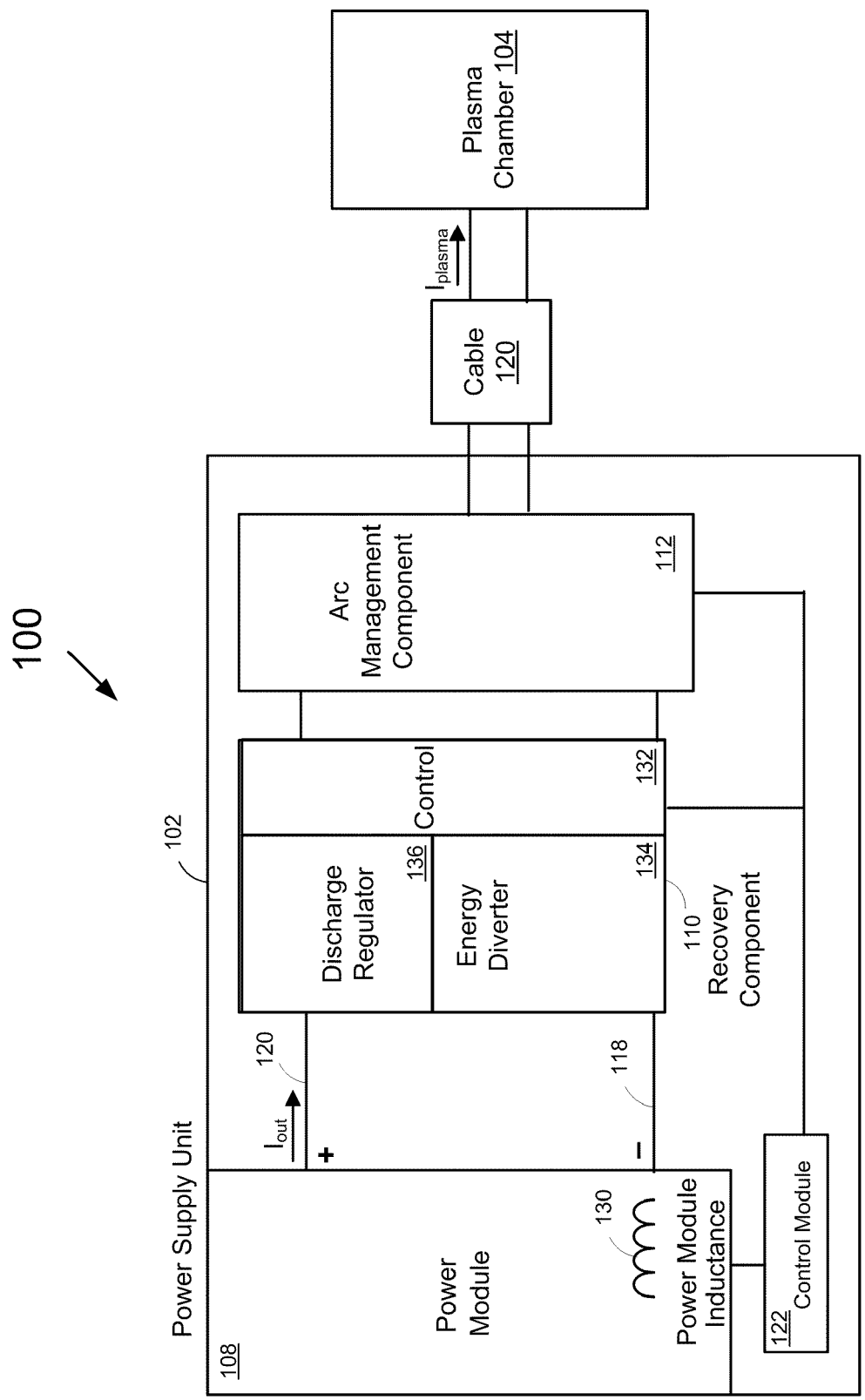
FIG. 1 is a block diagram depicting an exemplary embodiment of the invention.

Referring now to the drawings, where like or similar elements are designated with identical reference numerals throughout the several views, and referring in particular to FIG. 1, it illustrates is a block diagram 100 depicting an exemplary embodiment of the invention. Shown is a power supply unit 102 that is connected to a plasma chamber 104 with a supply cable 120. As depicted, the power supply unit 102 includes a power module 108 that is connected to a recovery component 110 and an arc management component 112, which is coupled to the supply cable 120. As shown, the recovery component 110 in this embodiment includes a control portion 132, an energy diverter 134, and a discharge regulator 136. Also depicted is a control module 122 that is connected to the power module 108, the recovery component 110, and the arc management module 112.

The illustrated arrangement of these components is logical, the connections between the various components are exemplary only, and the depiction of this embodiment is not meant to be an actual hardware diagram; thus, the components can be combined or further separated in an actual implementation, and the components can be connected in a variety of ways without changing the basic operation of the system. For example, the recovery component 110 of the power supply unit 102 is divided into three functional components in the exemplary embodiment, but the functions of these components could be subdivided, grouped together, deleted and/or supplemented so that more or less components can be utilized in any particular implementation. As another example, the functionality of the control module 122 and control portion 132 (which may be realized by hardware, firmware, software, or a combination thereof) may be combined or further distributed.

Thus, the power supply unit 102, power module 108, recovery component 110, arc management component 112, and control module 122 can be embodied in several forms other than the one illustrated in FIG. 1. Moreover, in light of this specification, the construction of each individual component is well-known to those of skill in the art.

In many embodiments, the power module 108 is a switching power supply that is configured to provide a voltage (e.g., a DC voltage) at a sufficient level to ignite and sustain a plasma that is contained in the plasma chamber 104. The plasma is generally used to process a work piece that is not shown but is well known to those skilled in the art. In one embodiment the power module 108 is configured in accordance with a buck topology, but this is certainly not required and in other embodiments the power module 108 may include any other viable power supply topology. As shown, the power module 108 provides a negative voltage via a first line 118 and a positive voltage via a second line 120.

The cable 120 is depicted as a single pair of conductors for simplicity, but in many embodiments the cable 120 is realized by a collection of two-conductor coaxial cables that connect the power supply unit 102 with the plasma chamber 104. And in other embodiments, the cable 120 is implemented with one or more twisted-pair cables. In yet other embodiments the cable 120 may be realized by any network of cable, including, but not certainly not limited to, a simple conductor hookup and quadrapole connections.

In general, the arc management component 112 in the exemplary embodiment is configured to prevent arcs from occurring in the first place and/or extinguish arcs that occur within the 104 plasma chamber. In some embodiments for example, the arc management component 112 is configured to detect arcs in the chamber 104, and in response to a detected arc, shunt current away from the plasma chamber 104.

The recovery component 110 generally operates to manage an application of power to the plasma chamber 104 after power to the chamber has been reduced. For example, the recovery component 110 may be used to manage an application of power to the chamber 104 during recovery from an arc event (e.g., after the arc management component 112 has extinguished an arc) or when the power supply unit 102 is initially started after a period of being shut-down.

As depicted, the recovery component 110 in this embodiment includes an energy diversion component 134 (also referred to herein as an energy diverter 134) that is configured (e.g., upon recovery from an arc management event or upon startup of the supply unit 102) to draw a decreasing amount of energy away from the plasma processing chamber 104 so as to increase a level of energy from a low level of energy (e.g., a level of energy that is insufficient to ignite the plasma) to a level sufficient to ignite plasma in the plasma processing chamber 104. In many variations, the decreasing amount of energy that is drawn away from the plasma chamber 104 limits a rate of change of voltage that is applied to the chamber 104, which reduces the possibility of an arc being generated in the plasma and/or potentially damaging voltage levels (e.g., voltage levels that would damage components of the supply unit 102).

The discharge component 136 (also referred to herein as a discharge regulator 136) is generally configured to draw energy away from the energy diversion component 134 so as enable the energy diversion component 134 to draw more energy away from the plasma chamber 104. The control component 132 is configured to control the operation of the discharge component 136 and the energy diversion component 134.

The control module 122 in this embodiment is configured to control one or more aspects of the power module 108, recovery component 110, and the arc management component 112. For example, during a first mode of operation, the control module 122 allows the power module 108 to apply power to output terminals of the power supply unit 102, and during a second mode of operation (e.g., in response to an arc being detected or a periodic clock signal), the control module 122 in this embodiment temporarily deactivates the power module 108 and prompts the arc management module 112 to extinguish the arc. And during a recovery mode of operation, the control module 122 activates the power module 108 and the recovery component 110 to reapply power to the chamber 104.

Figure 2:
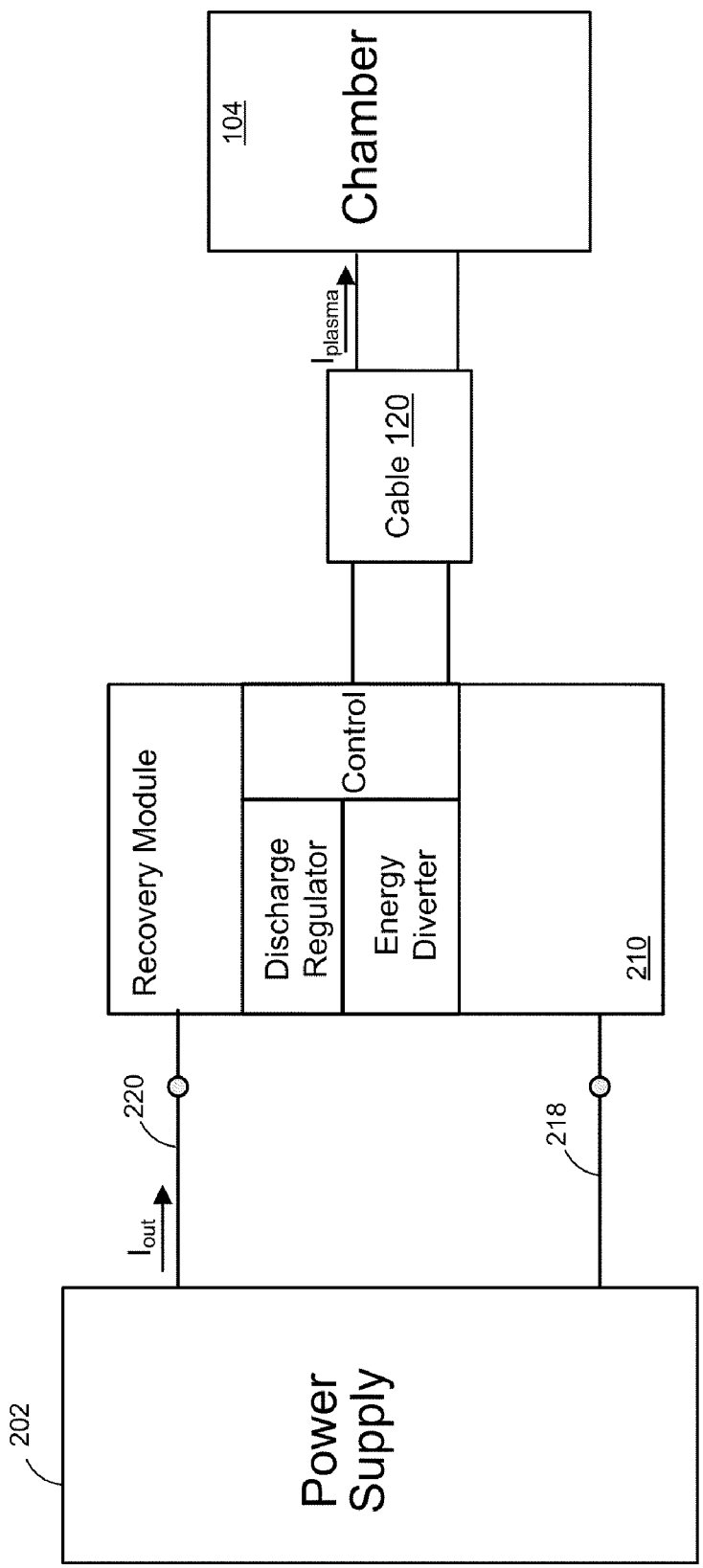
FIG. 2 is a block diagram depicting another exemplary embodiment of the invention.

As depicted in FIG. 1, the recovery component 110 and arc management component 112 in many embodiments are integrated within the power supply 102 (e.g., within the same housing), but this is certainly not required, and as shown in FIG. 2, a recovery component in other embodiments may be added as part of an accessory 210 (e.g., as a retrofit) to an existing power supply 202 (e.g., a power supply that includes arc management functionality).

Figure 3:
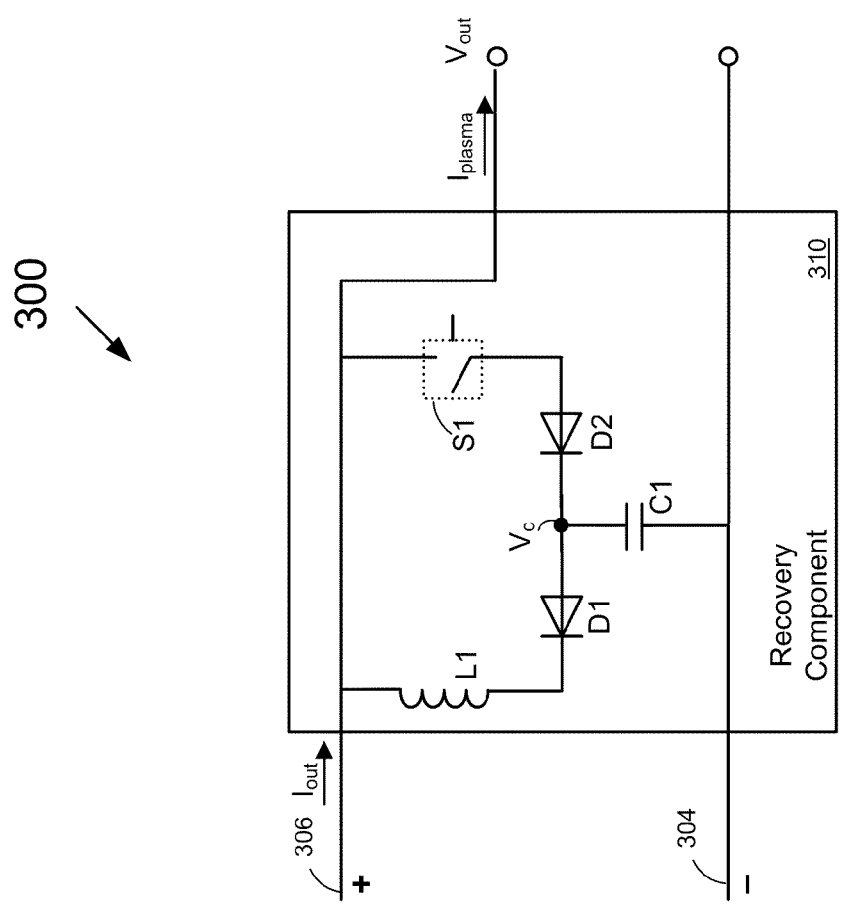
FIG. 3 is a schematic diagram depicting an embodiment of the arc recovery components depicted in FIGS. 1 and 2.

Referring next to FIG. 3, shown is a schematic diagram 300 of an exemplary embodiment of the recovery component described with reference to FIGS. 1 and 2. In this embodiment, the energy diverters depicted in FIGS. 1 and 2 are realized by a switch S1, a diode D2, and capacitor C1, which collectively form a current diversion path, and the discharge regulator depicted in FIGS. 1 and 2 are realized by diode D1 and inductor L1. As shown, the switch S1 (e.g., an insulated gate bipolar transistor (IGBT)) is configured to turn on (e.g., responsive to a control signal from the control component 132) to activate the recovery component 310. When the switch S1 is closed, output current from the power supply 102, 202 is redirected away from the plasma chamber 104, through diode D2, to capacitor C1 and as a consequence, the rise of the voltage that is applied by the recovery component 310 (and hence applied by the power supply 102, 202) to the plasma is gradual.

When implemented with the power module 108 or power supply 202 described with reference to FIGS. 1 and 2, respectively, a resonant circuit is formed including an output inductance $L_O$ of the power module 108 or power supply 202 and the capacitance C1. And the capacitor voltage, VC1(t), can be characterized as:

$$v_{C1}(t) = V_{C0}\cos(\omega_s t) + I_0 \sqrt{\frac{L_0}{C_1}} \sin(\omega_s t)$$

while the output inductor current, $iL_O(t)$, can be calculated as:

$$i_{L_O}(t) = V_{C0} \sqrt{\frac{C_1}{L_0}} \sin(\omega_s t) + I_0 \cos(\omega_s t)$$

Where: $L_0$ is the power module or power supply output inductance; C1 is the capacitor; $\omega_s$ is the resonant frequency; and $I_0$ is the output inductor current at the end of an arc shutdown time.

In operation, when the recovery component 310 is initiated (e.g., by closing S1), plasma voltage (Vout) and plasma current (Iplasma) gradually increases. This slow voltage rise allows plasma to develop without having an overvoltage condition and the plasma will start taking current from the power supply (the slope of the voltage can be adjusted by selection of the capacitor value for C1). In many modes of operation, once the plasma current becomes substantially equal to the supply current (e.g., Iout from the power module 108 or power supply 202), the overvoltage circuit is turned off, by turning off the recovery component (e.g., by opening S1).

When the switch S1 is open (e.g., when Iplasma is at a level associated with typical plasma processing), the capacitor C1 will discharge some stored energy through inductor L1. And the capacitor may also discharge much more energy through the inductor L1 during arc shutdown, when an output of the recovery component 310 may be shorted. One of ordinary skill in light if this specification will appreciate that L1 can be chosen to regulate how much the capacitor C1 needs to be discharged in order to provide optimal re-start after arc shutdown.

Figure 4:
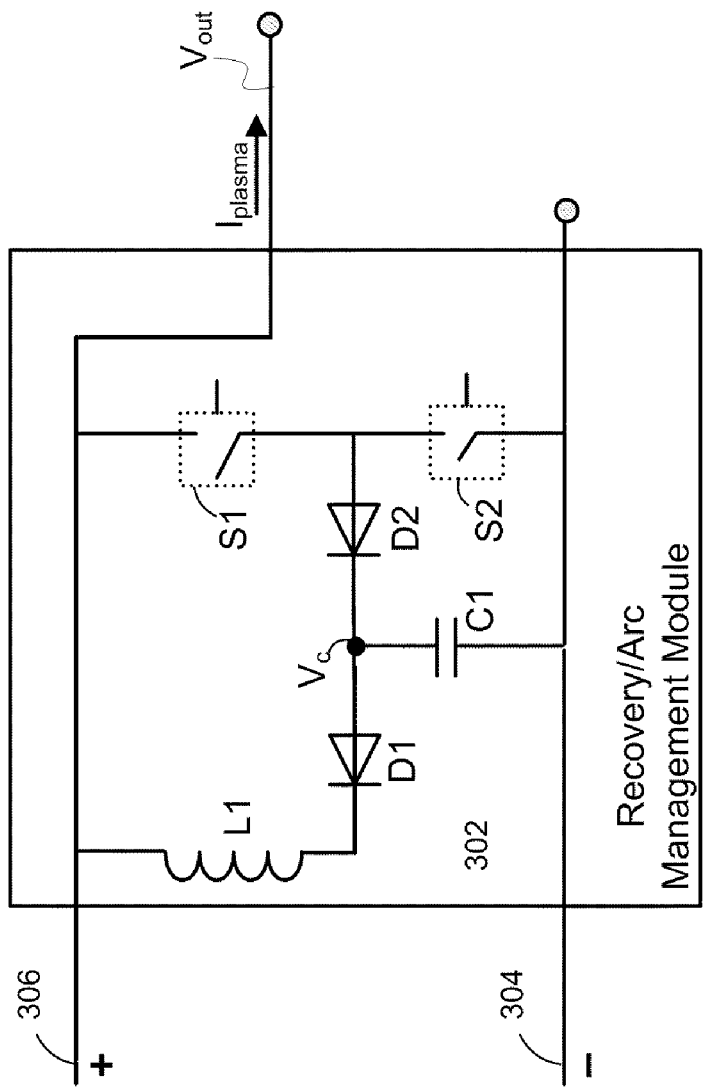
FIG. 4 is a schematic diagram depicting an exemplary embodiment of a recovery/arc management component that may utilized to implement the recovery component and arc management component depicted in FIG. 1.

Referring next to FIG. 4, an exemplary embodiment of an arc recovery/arc management component is depicted. In this embodiment the recovery component 110 and arc management component 112 described with reference to FIG. 1 share common components (e.g., switch S1 in this embodiment is a component of both the recovery component 110 and the arc management component 112). It should be recognized that this embodiment is merely exemplary and that the recovery component in other embodiments is realized as a separate component from the arc management component.

As shown, in this embodiment both switches S1 and S2 first turn on for an arc-shutdown event (e.g., responsive to a detected arc or to preempt an arc) and operate to re-direct output current away from plasma chamber through switches S1 and S2. Once arc shutdown is over, switch S2 opens and switch S1 remains closed, as described above with reference to FIG. 3, to carry out a recovery mode of operation. Specifically, after S2 is opened (and S1 remains closed) plasma voltage and plasma current gradually increase, which allows the plasma to develop without overvoltage and the plasma will start taking current from the power supply. Once plasma current becomes substantially equal to the supply current, the recovery portion of the recovery/arc management component can be turned off by opening S1.

The switches S1 and S2 in some embodiments are realized by an insulated gate bipolar transistors (IGBTs), and in other embodiments is a field effect transistor (FET). In yet other embodiments the series switches S1 and S2 may be implemented by an integrated gate commutated thyristor (IGCT), a metal-oxide semiconductor-controlled thyristor (MCT), a bipolar switch, or silicon-controlled rectifier. The diodes D1, D2 in the exemplary embodiments may be realized by fast recovery diodes.

Figure 5:
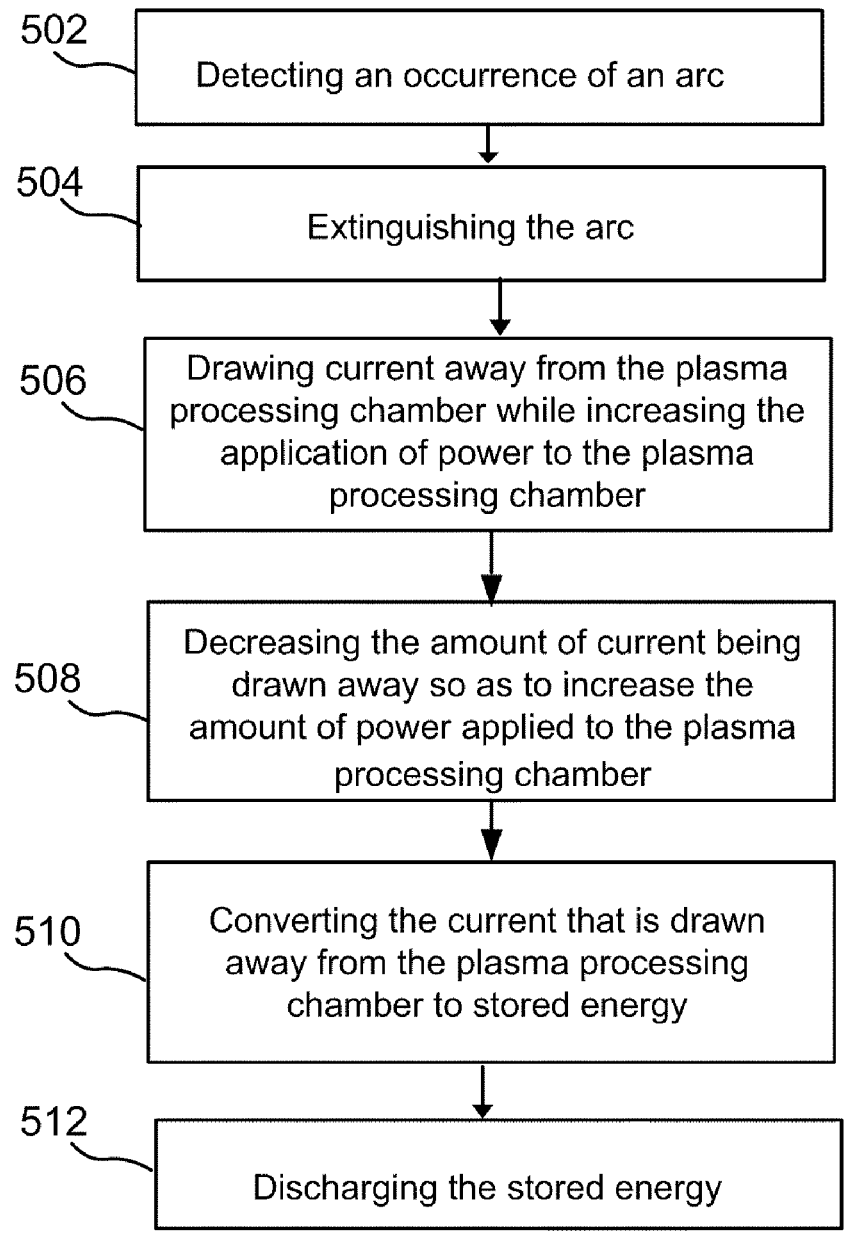
FIG. 5 is a flowchart depicting a method in accordance with many embodiments.

Referring next to FIG. 5, it is a flowchart depicting an exemplary method that may be carried out in connection with the embodiments described herein. While referring to FIG. 5, simultaneous reference will be made to FIGS. 6A-6E, which respectively depict, as a function of time, voltage applied to the plasma chamber; plasma current; current that is drawn away from the plasma chamber; current output from a power module (e.g., power module 108) or power supply (e.g., power supply 202); and capacitor voltage Vc (described with reference to FIGS. 3 and 4).

Figure 6A:
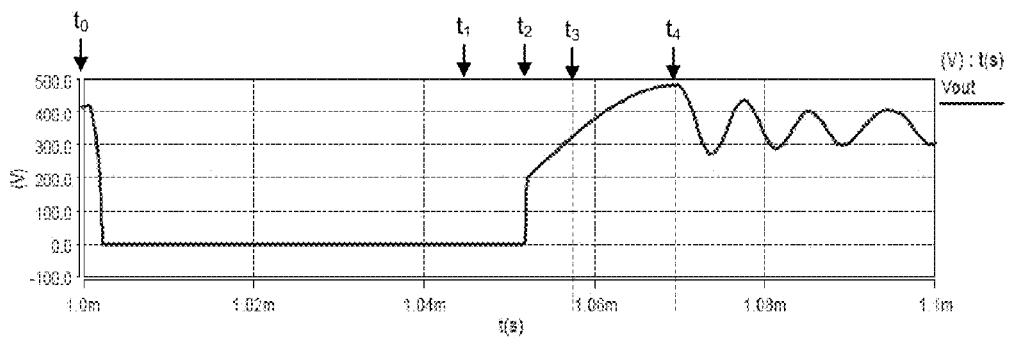
FIG. 6A is a graph depicting voltage that is applied to a plasma chamber as a function of time in accordance with many embodiments.
Figure 6B:
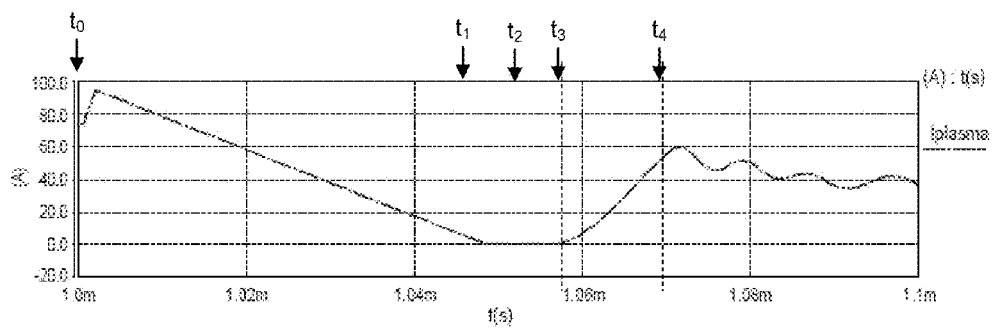
FIG. 6B is a graph depicting plasma current as a function of time in accordance with many embodiments.

As shown, responsive to an arc being detected in a plasma processing chamber (Block 502), the arc is extinguished (Block 504). Referring to FIGS. 6A and 6B, for example, just after a time $t_0$, a drop in voltage at Vout (e.g., the voltage applied to the plasma chamber) and rise in the plasma current indicates the presence of an arc, and in response, an arc management component (e.g., arc management component 112) operates to reduce a level of current provided to the plasma.

Figure 6C:
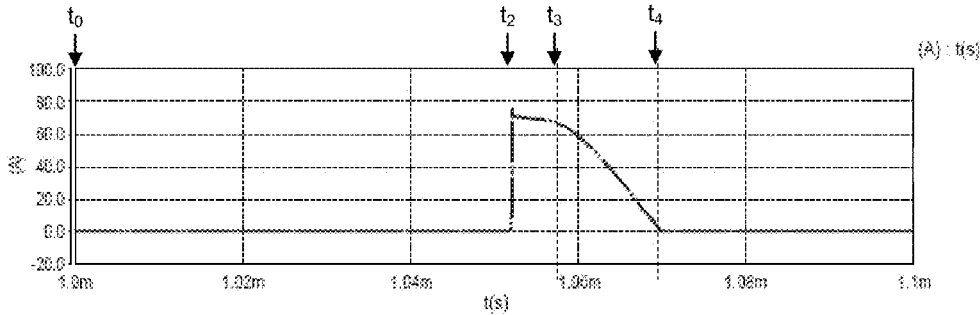
FIG. 6C is a graph depicting current that is redirected away from a plasma chamber as a function of time in accordance with many modes of operation.
Figure 6D:
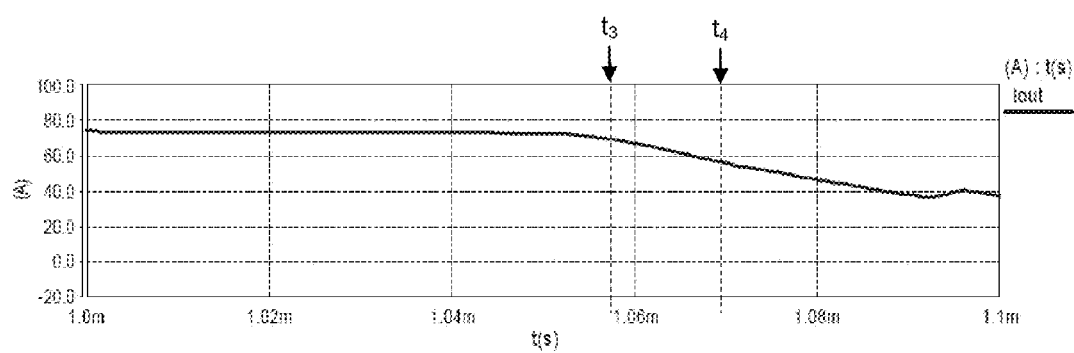
FIG. 6D is a graph depicting current that is output, as a function of time, from the power module depicted in FIG. 1 and the power supply depicted in FIG. 2.
Figure 6E:
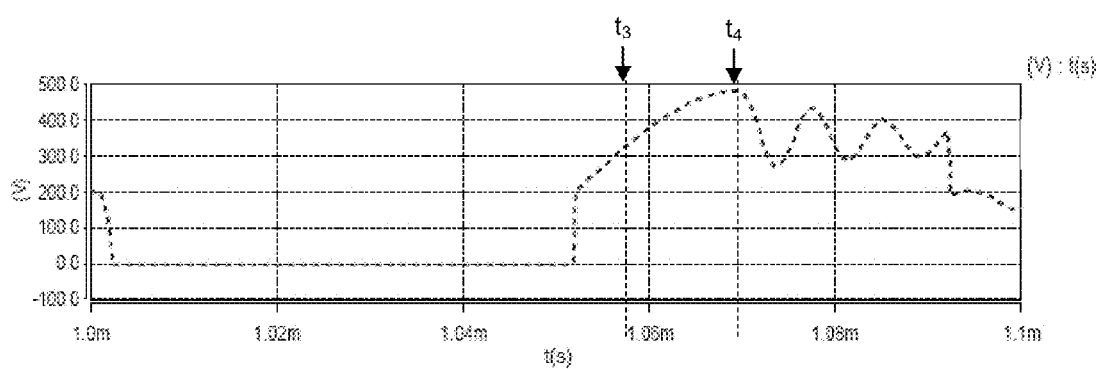
FIG. 6E is a graph depicting a voltage at the node Vc described with reference to FIGS. 3 and 4.

As discussed with reference to FIG. 4, for example, both switches S1 and S2 of the recovery/arc management module close for an arc-shutdown event and operate to re-direct output current away from plasma chamber plasma current. Once the arc is extinguished, an application of power is initiated to the plasma processing chamber (e.g., by power supply 102), and current is drawn away from the plasma processing chamber (e.g., by a current path formed by switch S1, D2 and C1 described with reference to FIGS. 3 and 4) while initiating the application of power to the plasma processing chamber (Block 506). As shown in FIGS. 6A and 6B, at a time $t_1$ the arc is extinguished, and at a time $t_2$ arc recovery begins and an application of power to the plasma chamber is initiated. In addition, as depicted in FIG. 6C, diversion current is simultaneously drawn away from the plasma chamber at the time $t_2$ (e.g., through the path formed by switch S1, D2 and C1 described with reference to FIGS. 3 and 4).

As shown in FIG. 5, an amount of current that is being drawn away from the plasma processing chamber is decreased so as to increase the amount of power that is applied to the plasma processing chamber (Block 508). As shown in FIGS. 6A and 6B and, at time $t_3$, the voltage across the plasma is high enough so that the plasma current starts rising, and as depicted in FIG. 6C the amount of current that is drawn away from the plasma chamber decreases during a time $t_3$ to $t_4$ so as to increase the amount of power that is applied to the processing chamber.

In particular, both the voltage Vout (depicted in FIG. 6A) and the current plasma Iplasma (depicted in FIG. 6B) gradually rise while the amount of current that is redirected away from the plasma chamber (depicted in FIG. 6C) is decreased. Beneficially, The decreasing amount of energy that is drawn away from the plasma chamber limits a rate of change of voltage that is applied to the chamber, which reduces the possibility of an arc being generated in the plasma and/or potentially damaging voltage levels (e.g., voltage levels that would damage components of the supply unit 102, 202). At a time $t_4$, the current that is redirected (depicted in FIG. 6C) is substantially zero, and the plasma current (depicted in FIG. 6B) and the current that is output from the power module (e.g., power module 108) or power supply (e.g., power supply 202)(depicted in FIG. 6D) are substantially equal, and at this time the recovery module may be disengaged (e.g., by opening S1).

In the exemplary method, the current that is drawn away from the plasma processing chamber is converted to stored energy (e.g., by capacitor C1 described with reference to FIGS. 3 and 4)(Block 510), and the stored energy is discharged (e.g., by the inductor L1 described with reference to FIGS. 3 and 4)(Block 512).

In conclusion, the present invention provides, among other things, a system and method for managing the power provided to a plasma-processing chamber so as to prevent undesirable (e.g., damaging) voltage levels. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A system for supplying energy to a plasma processing chamber, the system comprising:
   a power supply;
   a plasma processing chamber coupled to the power supply via a first power line and a second power line;
   an arc management component configured to extinguish an arc in the plasma processing chamber; and
   an arc recovery component configured to apply power to the plasma processing chamber after the arc has been extinguished, the arc recovery component including:
   an energy diversion component coupled by a switch across the first power line and the second power line to draw current away from the plasma processing chamber while power is applied to the plasma processing chamber during an initial period of time after the arc is extinguished, the amount of current being drawn away decreasing during the initial period of time so as to gradually increase an amount of power applied to the plasma processing chamber during the initial period of time; and
   a control component that controls the switch to couple the energy diversion component across the first power line and the second power line during the initial period of time after the arc is extinguished and decouple the energy diversion component from being across the first power line and the second power line after the initial period until another arc is detected.

2. The system of claim 1, wherein the arc recovery component includes an energy discharge component coupled to the energy diversion component, the energy discharge component configured to discharge at least a portion of the energy that is diverted so as to enable the energy diversion component to divert energy during a subsequent recovery cycle.

3. The system of claim 1, wherein the energy diversion component includes an energy storage component, the energy storage component drawing the current away from the plasma processing chamber and converting the current that is drawn away into stored energy.

4. The system of claim 3, wherein the arc recovery component includes an energy discharge component coupled to the energy storage component, the energy discharge component configured to discharge at least a portion of the stored energy so as to enable the energy storage component to store additional energy.

5. The system of claim 1, wherein the switch includes a switch selected from the group consisting of an insulated-gate bipolar transistor (IGBT), a metal oxide semiconductor field effect transistor (MOSFET), and a bipolar junction transistor (BJT), an integrated gate commutated thyristor (IGCT), a metal-oxide semiconductor-controlled thyristor (MCT), a bipolar switch, or silicon-controlled rectifier.

6. The system of claim 1, wherein the arc management component includes the switch and a second switch, the switch and the second switch are closed while the arc management component is extinguishing the arc so as to shunt current away from both the plasma processing chamber and the energy diversion component.

7. The system of claim 6, wherein the second switch is opened after the arc is extinguished and the first switch is opened after the initial period of time until another arc is detected.

8. A method for supplying energy to a plasma processing chamber, comprising:
   detecting an arc in the plasma chamber;
   diverting, responsive to the detected arc, current away from the plasma processing chamber to extinguish the arc;
   placing a current diversion path across inputs to the plasma chamber in response to the arc being detected;
   drawing current away from the plasma processing chamber through the diversion path while initiating an application of power to the plasma processing chamber during an initial period of time after the arc is extinguished, the amount of current being drawn away decreasing during the initial period of time so as to increase the amount of power applied to the plasma processing chamber during the initial period of time;
   removing the current diversion path after the initial period of time until another arc is detected;
   converting the current that is drawn away from the plasma processing chamber to stored energy; and
   discharging the stored energy.

9. The method of claim 8, including:
   increasing, during the initial period of time, an amount of voltage that is applied to the plasma processing chamber.

10. The method of claim 8, wherein drawing current away includes coupling the plasma processing chamber to an energy storage element, the energy storage element drawing the decreasing amount of current during the initial period of time.

11. The method of claim 8, wherein discharging the stored energy includes discharging the stored energy into at least one of the plasma processing chamber, a power supply that is applying power to the plasma processing chamber, or a resistor.

12. An apparatus for supplying energy to a plasma processing chamber, comprising:
   an input terminal adapted to receive power that is generated by a power supply;
   an output terminal configured to apply the power generated by a power supply so that the power may be utilized by a plasma processing chamber;
   an energy diversion component configured to draw a decreasing amount of energy away from the output terminal so that the output terminal is capable of gradually increasing a level of energy from a low level of energy that is insufficient to ignite the plasma in the plasma processing chamber to a level sufficient to ignite plasma in the plasma processing chamber;
   a first switch disposed to couple the output terminal to the energy diversion component, the energy diversion component including a capacitor to draw current away from the output terminal and convert the current to stored energy, the energy discharge component including an inductor configured to draw the stored energy from the capacitor so as to enable the capacitor to draw more current;

a second switch disposed in series with the first switch, the series combination of the first and second switches creating, when the first and second switches are closed, a current path to shunt current away from the output terminal so as to extinguish an arc in the plasma processing chamber; and an energy discharge component configured to draw energy away from the energy diversion component so as enable the energy diversion component to draw more energy away from the output terminal.

13. The apparatus of claim 12, including:

a switch disposed between the output terminal and the energy diversion component, the switch coupling the output terminal to the energy diversion component so as to provide a current path between the output terminal and the energy diversion component, the switch being open when current that is flowing from the output terminal to the plasma processing chamber reaches a desired level.

14. The apparatus of claim 12, including:

an arc management component configured to divert current away from the output terminal so as to extinguish an arc in the plasma processing chamber, and when the arc is extinguished, to discontinue to divert current away from the output terminal;

wherein the energy diversion component is configured, subsequent to the arc being extinguished, to draw the decreasing amount of current away from the output terminal so as to gradually increase the amount of current flowing from the output terminal to the plasma processing chamber after the arc is extinguished.

15. The apparatus of claim 12, wherein the second switch is disposed in parallel with the capacitor so as to shunt current away from the capacitor when the first and second switches are closed, and once the arc is extinguished, the second switch is opened so as to enable the current to flow through the first switch to the capacitor.

* * * * *